United States Patent [19]

Chen

[11] 4,218,761
[45] Aug. 19, 1980

[54] MAGNETIC BUBBLE DOMAIN DECODER ORGANIZATION

[75] Inventor: Thomas T. Chen, Yorba Linda, Calif.

[73] Assignee: Rockwell International Corporation, El Segundo, Calif.

[21] Appl. No.: 958,924

[22] Filed: Nov. 8, 1978

[51] Int. Cl.$^2$ .............................................. G11C 19/08
[52] U.S. Cl. ........................................... 365/4; 365/15
[58] Field of Search .......................... 365/4, 14, 15, 16

[56] References Cited

U.S. PATENT DOCUMENTS

| | | | |
|---|---|---|---|
| 3,770,895 | 11/1973 | Krupp et al. | 365/4 |
| 3,858,188 | 12/1974 | Keefe | 365/4 |

*Primary Examiner*—James W. Moffitt
*Attorney, Agent, or Firm*—H. Fredrick Hamann

[57] ABSTRACT

There is shown and described a magnetic bubble domain decoder organization which is especially adaptable to a single port configuration. A plurality of separate storage loops are utilized to store data in the form of magnetic bubble domains. An input/output section is provided for supplying data to the storage loops. A crossover junction circuit permits information to be propagated along a single input/output loop into and out of the storage loops. Input and output decoder circuits are provided in each storage loop to control the data which is stored therein. Control circuits such as tranfer switches, universal switches, retarding networks and the like are arranged to control the movement of magnetic bubble domains in the storage loops. By operation of the various control circuits, interwoven data in the storage loops can be selectively separated and retrieved at the input/output section.

10 Claims, 4 Drawing Figures

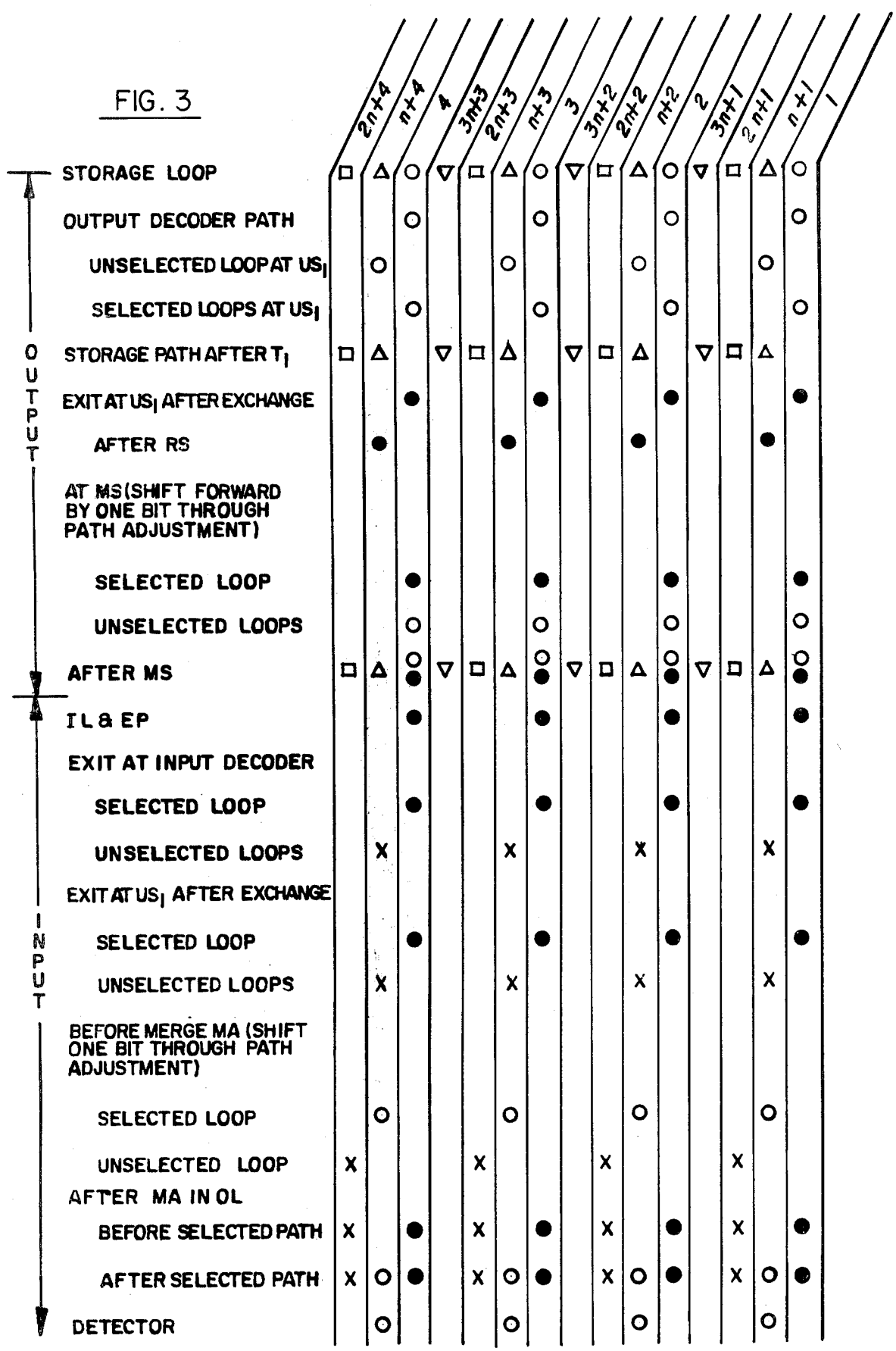

MAGNETIC BUBBLE DOMAIN DECODER ORGANIZATION

BACKGROUND OF THE INVENTION

1. Field of the Invention

This invention is directed to magnetic bubble domain systems, in general, and to a decoding organization arrangement, in particular.

2. Prior Art

Magnetic bubble domain devices are now well known in the art. These magnetic bubble domain devices are beginning to supplant other types of devices, notably in the area of memory devices. As magnetic bubble domain devices are used more and more extensively, greater emphasis is placed upon system organization in order to permit greater utilization of devices while improving reliability, manufacturing yields and, as well, permitting advanced miniaturization of the devices.

Many decoding schemes are known in the art, including the magnetic bubble domain art. However, improved decoding schemes are always being sought and considered. It is highly desirable, in many applications, to have a decoder configuration which is capable of being accessed from the same side (or edge) of the device during both the input and the output operation. This operation provides a so-called "single-port decoder". One of the problems with such a single port decoder has been the necessity to have data from the input path cross over the output path and vice versa. This has, in the past, generally created problems in the operation of the devices.

A new and improved "Crossover Junction for Magnetic Bubble Domain Circuits" is described in co-pending application Ser. No. 886,972 by T. T. Chen, filed on Mar. 15, 1978 and incorporated herein by reference. This new crossover junction permits a common input/output path to be utilized with a plurality of storage loops.

PRIOR ART STATEMENT

The most pertinent prior art known to applicant is listed herewith.

U.S. Pat. No. 3,543,255, Morrow et al, "Single Wall Domain Apparatus Having Intersecting Propagation Channels". This patent shows a crossover circuit which requires an idler bubble to be stored and selectively displaced in and from the system.

U.S. Pat. No. 3,676,873, Lee, "Magnetic Bubble Crossover Circuit". This patent shows a crossover circuit which requires that bubbles which pass each other be separated in time by momentarily retarding at least one of the bubbles.

"Parallel Processing with the Perfect Shuffle", Stone, IEEE Transactions on Computers, Vol. C-20, No. 2, February 1971, pages 153-161. This publication discusses parallel processing but is not directed to magnetic bubble domain systems.

"A Hybrid Decoder Bubble Memory Organization", T. T. Chen et al, IEEE Transactions on Magnetic, Vol. MAG-12, No. 6, November 1976. This publication is directed to a hybrid bubble organization which uses a decoder with one or more retarding switches.

"Device Characterization of a Complete Set of Passive Bubble Logic Functional Elements", C. T. M. Chang, 3M Conference, 1975. This paper reports the operating characteristics of several passive logic elements including a bubble crossover element.

"An All-Bubble Text-Editing System", S. Y. Lee and H. Chang, IEEE Transactions, MAG-10, 1974, pages 746-749. This paper describes a bubble domain system which replaces a semiconductor counterpart system.

"Multiple Level Storage Organization for Bubble Memories", T. T. Chen et al, IEEE Transactions on Magnetics, MAG-12, No. 6, November 1976, page 629. This paper describes bubble domain storage and flow control switches.

H. Chang, J. Fox, D. Lee and L. L. Rosier, "A Self Contained Magnetic Bubble Memory Chip", IEEE Trans. Mag. MAG-8, 1972, pp. 214-222.

G. S. Almasi, E. A. Giess, R. J. Hondel, R. E. Horstman, G. E. Keefe, and L. L. Rosier, "Fabrication and Operation of a Self-contained Bubble Domain Memory Chip," AIP Conf. Proc., No. 5, pt. 1, pp. 220-224.

U.S. Pat. No. 3,991,411, George, "Single Decoder Bubble Domain Chip Organization". This patent relates to a decoder which shares the input decoder and the output decoder leads.

SUMMARY OF THE INVENTION

This invention is directed to a decoding organization for use with magnetic bubble domain systems and the like. The decoder includes a crossover circuit junction which permits a single input/output circuit port to be used. Information or data in the form of magnetic bubbles is stored in a storage means in such a manner that multiple data streams can be interleaved or interwoven in order to maximize the storage capability of the system. Appropriate input and output decoder devices are used to control the information to be acted upon by the system as well as the action to be taken. Control devices such as universal switches, transfer switches, retarding devices and delay circuits are used to maintain synchronism and order in the data stored and retrieved.

BRIEF DESCRIPTION OF THE DRAWINGS

FIG. 3 is a timing chart arrangement showing the relationship of the signals in the decoder organization of the instant invention.

DESCRIPTION OF THE PREFERRED EMBODIMENT

Figure 1:
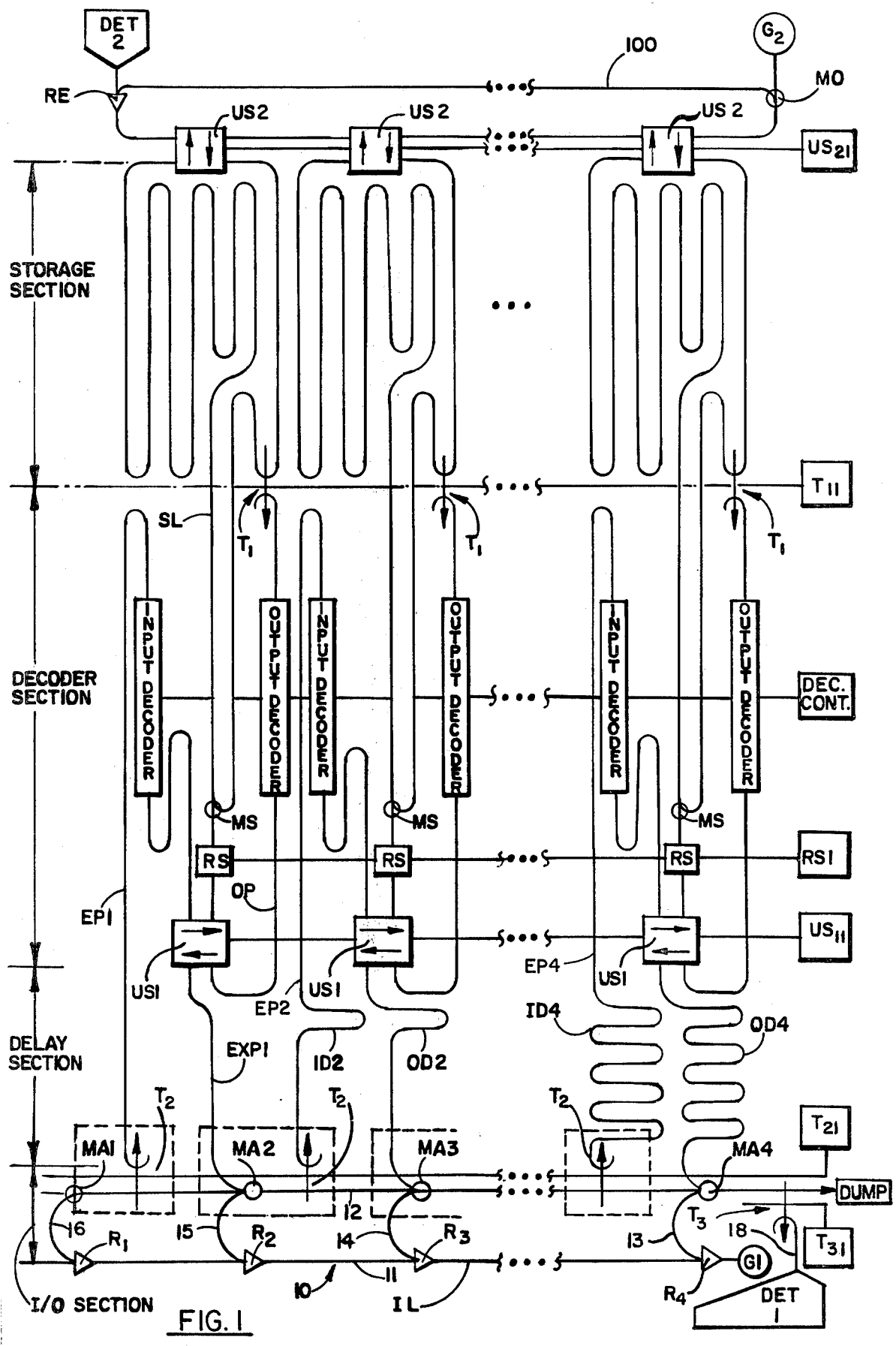
FIG. 1 is a schematic diagram of the decoder organization of the instant invention.

Referring now to FIG. 1, there is shown a schematic diagram of the decoder organization of the instant invention. In the diagram shown in FIG. 1, an optional two port configuration is illustrated. However, the main advantage of the invention is directed to a single port configuration. That is, the conventional decoder accessed bubble memory chip has decoders (input and output) at both ends of the storage loops which, thus, forms a two port configuration. The subject invention, however, describes a single port arrangement which has the following advantages.

1. Both input decoder and output decoder are on the same side of the storage loop and can share the same decoder control leads. Thus, the total number of control leads is minimized in the chip. Also, the the garnet area required for the decoder circuit is reduced.

2. Inasmuch as the decoder access is on one end of the storage loop, the other end of the loop can be used for other data manipulation functions. For example, a major-minor loop access port at the other end permits the data stored in the storage loops to be accessed in two dimensions.

3. The single port arrangement can be utilized as a multi-level storage organization. The storage loops are connected to several groups of storage loops through exchange switches. Each group forms a storage level and data can be transferred back and forth between levels. Only the data in the loops connected to the access port are directly accessible. Thus, the chip may have a large storage capacity but its performance is equivalent to a small chip with short storage loops.

In the embodiment shown in FIG. 1, an example of the on chip decoder access port is provided and includes an input/output section 10. Input/output section 10 includes input line 11 and output line 12. These lines are arranged to form a continuous propagation path. A plurality of replicators R1, R2 and R3 are included in input line 11. Replicators R1, R2, R3 and the like are passive replicators and produce a plurality (in this case two) output magnetic bubble domains for each input magnetic bubble domain. The output bubble domains either continue along the output portion of input line 11 or, alternatively, along connector propagation paths 15, 14, and 13, respectively. The connector paths join with output line 12 at merge/annihilators MA1, MA2, MA3, respectively. The merge annihilators are equivalent to a true "AND" gate and are described in detail relative to FIG. 4.

A suitable bubble domain generator G1 of any suitable configuration such as a loop generator, a disk generator or the like is associated with input line 11 and supplies magnetic bubble domains thereto. A suitable output dump or sink is associated with output line 12 to receive magnetic bubble domains which are generated therealong and not transferred to the detector circuitry.

Detector DET 1 is associated with output line 12. Propagation path 16 which forms a portion of the detector is selectively connected to output line 12 in accordance with the operation of transfer switch T3. Switch T3 is represented by an arrow and, under control of signals from source T31 selectively transfers magnetic bubble domains from output line 12 to propagation path 16.

Each of the storage loops in the apparatus is connected to output line 12 by means of a separate transfer switch T2. Again, switches T2 are controlled by signals from source T21 to selectively transfer magnetic bubble domains from output line 12 to entering path EP of the respective storage loops.

At the output end of the storage loops, the exit propagation path EXP is joined to output lines 12 by the appropriate merge annihilate elements MA1, MA2 and so forth as described supra. The combination of transfer switch T2 and the merge functions in a manner to provide a crossover junction as described in the co-pending application to T. T. Chen (Ser. No. 886,972) which is noted supra.

When information in the form of bubbles is transferred into a storage loop, it propagates through the appropriate entering propagation path EP to the appropriate input decoder. The input decoders are controlled by the decoder control signals produced by decoder control circuitry (DEC. CONT.). In accordance with the operation of the input decoder, the bubbles propagate to the associated universal switch US1 which is utilized to transfer or exchange information in either direction. The operation of the universal switch is controlled by the signals supplied by source US11. Depending upon the control signals supplied by source US11 the bubbles in the propagation path may propagate therethrough to the appropriate merge associated with the storage loop involved. Conversely, the bubbles may be transferred to or exchanged with other bubbles in the other portion of the storage loop, per se. When the bubbles are transferred to the storage loop, per se, they propagate therethrough in the standard manner as controlled by the applied rotating and bias fields.

Included in the propagation path is a retard switch RS which is connected to source RS1 to receive control signals therefrom. Retard switch RS is of known configuration and functions to selectively retard the propagation of bubbles through the propagation path. The bubbles then pass through the storage loop merge MS in standard fashion. The bubbles continue to propagate through the path in the standard manner as noted above.

The storage propagation path includes the transfer switch T1 which is connected to be controlled by signals from control signal source T11. In the absence of a signal from source T11, the bubbles are not transferred and continue to propagate through the storage loop which includes a portion of switch T1 as well as merge MS. Conversely, with the application of the appropriate control signal from source T11, bubbles are transferred through switch T1 from storage loop SL to output path OP which includes an output decoder. The output decoders are also connected to receive control signals from the decoder control circuits (DEC. CONT.) wherein information in the form of bubbles is decoded by the output decoder. The bubbles in output path OP are propagated along output path OP to universal switch US1 and then either transferred to exit path EXP or maintained in path OP which returns the bubbles, via retard switch RS and merge MS, to storage loop SL. The output decoding function involving transfer switch T1, output decoder OD, and retarding switch RS is similar to the output decoding function in a two port hybrid decoder organization as described in the referenced paper entitled "A Hybrid Decoder Bubble Memory Organization", by T. T. Chen et al.

It is seen that each of the entering paths EP and exit paths EXP have different configurations in order to provide different delay times. For example, the leftmost storage loop circuitry includes enter path EP and exit path EXP with substantially zero delay (beyond normal propagation time). The second from the left storage loop arrangement includes an input delay ID2 and an output delay OD2 which delays are represented by loops in the propagation paths. The delay mechanism can be of any configuration desired or necessary in the structure of the device. Similarly, the right most storage loop circuitry includes input delay ID4 and output delay 0D4 in the entering path and exit path, respectively. It will be seen that the delay paths are related to the propagation path length in I/O loop 10 and are useful to maintain synchronism in the operation of the decoder of this invention. In particular, the length of the delay paths are so adjusted that the distances between generator G1 or detector DET 1 to the universal switches US1 in every storage loop are all of equal length.

An optional input/output path 100 is shown at the top end of the circuit configuration to illustrate the advantage of a single port decoder organization. This input/output loop includes generator G2 of any suitable configuration and detector DET 2 which is also of any suitable configuration. An optional merge MO and replicator RE are provided to permit bubbles to be merged or replicated in a usual manner. In addition, universal switches US2 are associated with input/output loop 100 and each of the respective storage loops. Each of the universal switches US2 is connected to be controlled by signals supplied by control source US21. In this arrangement, bubbles can be generated at generator G2, passed through merge MO and all bubbles are selectively applied to the respective storage loops concurrently by means of control signals supplied by control element US21. Conversely, bubbles can be obtained from the storage loops by appropriate selection of control signals at source US21 which bubbles can then be propagated through loop 100 and detected at DET 2 and, as well, replicated by a replicator RE for recirculation. This is representative of a conventional major-minor loop access port.

It must be understood, that input/output loop 100 is optional and need not be included in the invention, per se, which is especially directed to a single output port decoding apparatus. However, the optional input/output loop 100 permits the conversion of the invention to a two port decoder major-minor organization format while maintaining the advantages of the basic circuit.

As described by Chen et al in the Hybrid Decoder Organization publication noted supra, the particular chip is operated in M-bit spacing. That is, for consecutive data stream, each data bubble is separated by M periods. For the present discussion, M is assumed to be 4. All of the control functions are operated on a once every M cycle basis. In this arrangement, there are M time slots associated with each data bit. Thus, M different data streams may share the same propagation path with each data stream occupying a different time slot in the M slots. Transfer switches operate in different time slots and select the particular data stream in that time slot. In the embodiment shown, M is assumed to be 4.

During operation of the circuit shown in FIG. 1, magnetic bubble domains are generated by generator G1 and caused to propagate along input line 11 of I/O section 10. The bubbles propagate from right-to-left (in FIG. 1) along propagation path 11 and through respective replicators R4, R3, R2, R1 and so forth. This bubble occupies the first slot of the four slot basis illustrated in FIG. 3. In addition, the bubbles propagate through the connector paths 13, 14, 15, 16 and the like and are applied to output line 12 via the respective merge devices MA4, MA3, MA2, MA1 and so forth. The bubbles, if untransferred, to the decoder section, propagate along line 12 toward the appropriate disposal location which is identified as DUMP. In the event that a bubble propagating along output line 12 is intended to be detected (rather than dumped), appropriate signals are supplied by source T31 such that switch T3 is activated and bubbles are transferred therethrough from output line 12 to path 18 and, thence, to detector DET 1.

Conversely, if input bubbles are to be stored in the appropriate storage loop, signals of time slot 1 are supplied by source T21 to transfer switches T2 such that all input bubbles are transferred from line 12 through switches T2 to the entering paths EP of all the storage loops. For example, a bubble propagating along line 11 is replicated at replicator R2 so that a bubble passes toward replicator R1 and also toward, and through, merge MA2. The replicated bubble then propagates along line 12 and is, in response to the appropriate signal from source T21, transferred through switch T2 to entering path EP of the appropriate storage loop.

In the illustration of FIG. 1, the bubble propagates through the entering path EP2 which includes input delay ID2. This delay is substantially equivalent to the time period required for the replicated bubble to pass from replicator R2 through to switch T2 via replicator R1 and merge MA1.

Because of the input delay arrangement, all bubble streams reach the input decoders of the respective loops at the same time. When the input decoders are operated by application of signals from DEC. CONT. all of the input data streams are in synchronism. The input decoders are operated with retarding switches as the output decoder. That is, at the exit of the input decoders, all the input bubble streams will be delayed by one bit position (i.e. slipped one time slot) except the bubble stream in the particular path selected by the input decoder. Thus, when the input bubble streams reach the universal switches US1, only one input data stream (the undelayed data stream) can be transferred into the selected storage loop in response to a control signal from source US11. The unselected bubble streams are propagated toward merge annihilators MA through exit paths EXP. The path lengths are adjusted so that when these unselected bubbles reach MA, they are further offset by one bit time and occupy time slot 3, as shown in FIG. 3.

When a data block is selected for output at the same time as a data block is to be written in, the old data block can be exchanged with the new data block at universal switch US1. The output data block then occupies time slot 2 when it merges into path 12 through the merge-annihilators MA.

If a non-destructive read is required, no new data block is written in. The selected block will be replicated at switch US1 whereby output data are obtained and stored data are retained.

In particular, the input bubbles are generated on a "once every four bit" basis and propagated along input line 11. When the bubbles are propagated through replicators R1, R2, and R3 they pass through the respective connector paths and are merged into input line 12 at merges MA1, MA2 and MA3. The bubbles, which are selected for storage, are transferred through transfer switch T2, through enter path EP and the appropriate input delay ID (if any). The bubbles are then applied to the input decoder and decoded in accordance with the signals supplied by decode control source DEC. CONT. Basically, in a preferred embodiment, the input decoders function on a bubble delay basis. That is, bubbles which are not delayed, are applied to universal switch US1 at the appropriate time in accordance with the application of a signal from source US11. With this condition, the bubbles are transferred to the storage loop SL (or exchanged with bubbles in the storage loop) thereby accomplishing selective write-in. On the other hand, if the bubbles are delayed by the input decoders (i.e. the bubbles are not selected for transfer into the storage loop), the bubbles will continue to propagate through universal switch US1 to exit path EXP whence they will be merged into output line 12 at the appropriate merge annihilator. The path length is adjusted such that when bubbles are returned to output line 12 via the appropriate merge annihilator, the position of the bubbles will be shifted a distance equivalent to 2 bits with respect to the input data on line 11. This shift permits the bubbles to be returned to the bubble stream in synchronism.

Similarly, to receive output information which is stored in the storage loop, transfer switch T1 is accessed by applying the appropriate signal from source T11. For simplification of discussion, the selected block is assumed to be in the first slot of the 4 bit time slots as shown in FIG. 3. Since the selection of time slots are relative, it can be assumed that the time slot is in reference to the selected block. As a result, data is transferred from storage loop SL to the appropriate output decoder. The output decoder again uses the bubble delay operation. Thus, the bubble stream in a selected storage loop is propagated to the universal switch US1 without delay in accordance with the signals supplied by decoder control source DEC. CONT. Conversely, all of the bubble streams in the remainder of the loops will be delayed by one bit (shifted to time slot 2) at the exit of the output decoders.

By causing universal switch US1 to be operated once every four cycles at time slot 1, the non-delayed bubble stream can be transferred to or replicated out of output path OP to exit path EXP via universal switches US1. After passing through the universal switch, the underlayed bubble stream is delayed at retard switch RS by application of the retard signal from source RS1. However, the delayed signals from the unselected output decoders are not delayed by switch RS in the respective storage loops. Consequently, all of the bubbles in the respective storage loops are returned to synchronism as they pass through retard switches RS. The resynchronized bubbles then merge back into the bubble streams in the storage loops with the bubbles filling the empty slots which were created by the first transfer action at transfer switch T1. That is, the propagation path in the storage loop between transfer switch T1 and merge MS is one bit length longer than the propagation path between switch T1 and merge MS via the output decoder. Moreover, the output bubble stream which has been transferred or exchanged out of output path OP via universal switch US1 is propagated along exit path EXP and merged into output line 12 at the appropriate merge. These bubbles are then propagated along output line 12 and, selectively, transferred to detector DET 1 via transfer switch T3.

Figure 2:
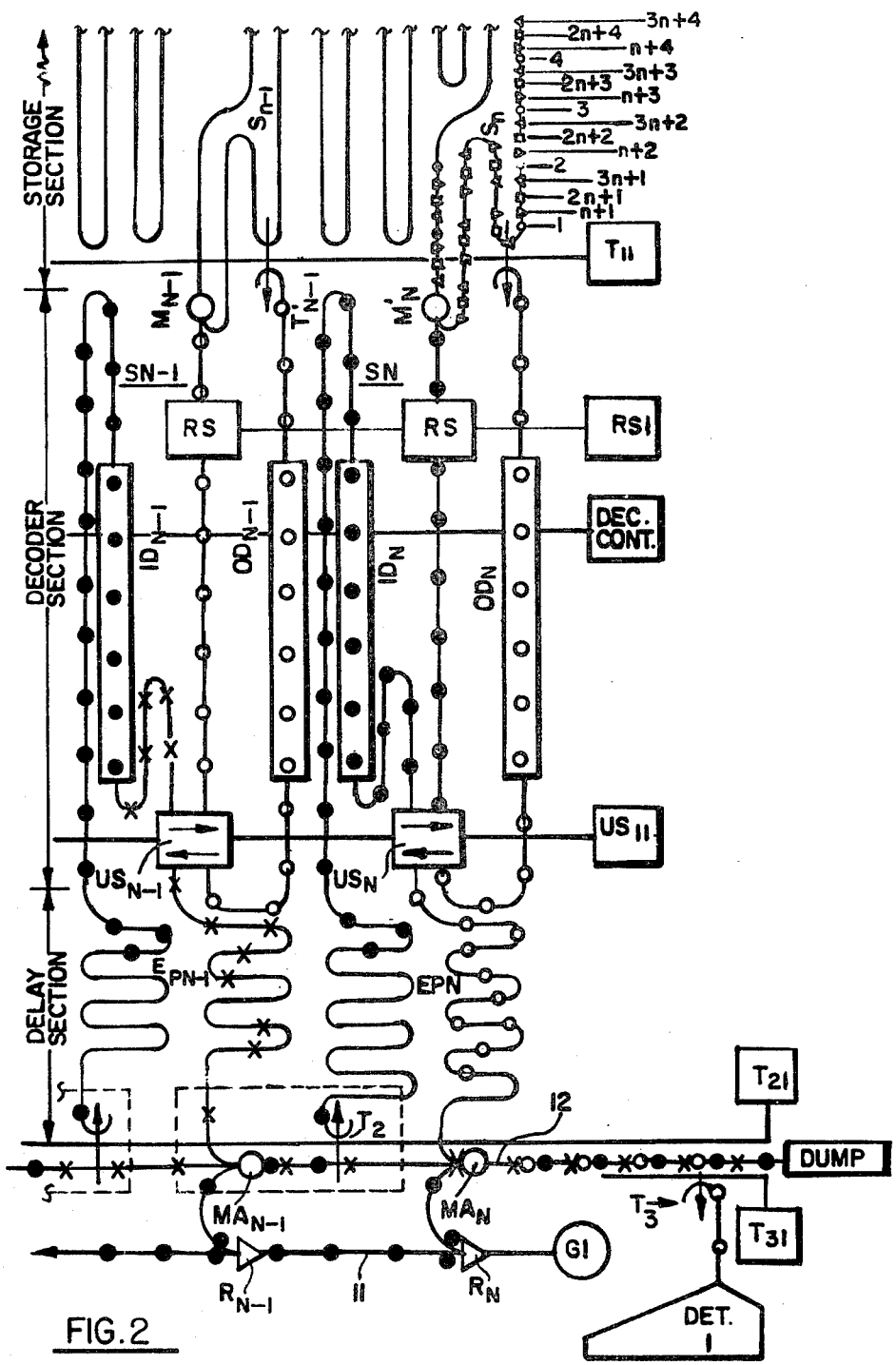
FIG. 2 is a schematic diagram of a detailed portion of the decoder organization shown in FIG. 1.

Referring now to FIGS. 2 and 3, concurrently, there is shown, in greater detail, a portion of the decoder system of the instant invention as well as the relationship of the bubbles therein. In particular, in FIG. 2, there are shown portions of two storage loops SN and SN-1 as well as input line 11, output line 12 and detector DET 1. In particular, generator G1 produces input bubbles as described relative to FIG. 1. The input bubbles are represented by solid dots. The input bubbles propagate through input line 11 as well as through the connector paths associated with the passive replicators RN and RN-1. Thus, input bubbles are returned to output line 12 via the merge-annihilators $MA_{N-1}$ and $MA_{N2}$ therein. Consequently, solid dot input bubbles are found in input line 11 and output line 12.

In addition, with the appropriate operation of transfer switch T2, input bubbles are transferred from output line 12 to entering path EP of the respective storage loops. Only that portion of entering path EP of storage loop SN are shown. This condition is representative of a specific arrangement wherein input bubbles are transferred into storage loop SN and not into storage SN-1. However, prior input bubbles are already propagating through storage loop SN as represented by the solid dots. The solid dots also propagate through the respective input decoders IDN and IDN-1.

The input bubbles, when decoded by the input decoders, in accordance with the control signals from the decoder controller, are, selectively, transferred to the respective storage loops via universal switch US1. Thus, solid dot input bubbles are shown propagating along storage loop SN.

Conversely, input bubbles not selected are delayed by one time slot and are not transferred to the storage loop by universal switch US1. These unselected input signals are passed through the universal switch into the exit path EXP. The unselected input signals are represented by X's as is noted in exit path EXP of storage loop SN-1. The unselected input bubbles (X) are then merged into output line 12 via the respective merge-annihilator junction.

Both the input decoder and the output decoder have the same coding arrangement and share the same driver DEC. CONT. When a particular input decoder path is selected, the corresponding output decoder path is also selected i.e. bubbles passing through these paths will not be delayed. In the event that the input signal is not selected and propagated through to output line 12, the bubbles already stored in the respective storage loops are also not selected. These bubbles are represented by open circles and continue to propagate through the storage loop as suggested in storage loop SN-1. Conversely, for the selected loop the stored bubble is exchanged with an input bubble at the universal switch, the input bubble (solid dot) replaces the output bubble (open circle) in the storage loop. The output bubble then propagates through the respective exit path EXP and is merged into output line 12 at the respective merge-annihilator. Thus, solid dot input bubbles, open circles output bubbles and X unselected input bubbles are shown propagating along output line 12 toward transfer switch T3. The operation of transfer switch 13 is noted above and is similarly operative here. Typically, output bubbles (open circles) will be transferred from output line 12 to detector DET. 1, while unselected input signals and untransferred input signals will be propagated through to the dump.

The typical unselected operation is shown relative to storage loop SN-1. In this case, input signals (solid dots) are not selected for transfer to the storage loop and are shown as X's at the output of the input decoder. Likewise, stored bubbles (open circles) are not selected for transfer to the exit path at US1 and continue to propagate through storage loop SN-1.

The selection means for input and output are the same. That is, the stored signals are effectively decoded in response to decode control signals supplied from DEC. CONT. source to the output decoder. As a result, certain bubbles in the storage loop are retarded by output decoder ODN. The retarded bubbles are not transferred through universal switch US1. However, certain bubbles are not retarded as a result of the decoding scheme. The unretarded bubbles are transferred to the exit path EXP via the universal switch. That is, the unretarded bubbles in both input path and storage loops are exchanged at US. The relationship between the retarded and unretarded bubbles is represented in storage loop SN1 with the unretarded input bubbles (solid dots) being located one bit time prior to the related storage bubbles (open circles). Consequently, the new input formation precedes the general information stored in the storage loops by one bit time. Likewise, in the case of non-destructive read out, the output information is replicated out and the remaining information precedes the general information by one bit time, remaining information precedes the general information by one bit time. However, retard switch RS is operative at the appropriate time to retard bubbles which are applied at a specific time. In accordance with the operation of this system, the retard switch is operative at a time which is related to the application of the input bubble. Consequently, the input bubbles are retarded by one bit time wherein the input bubble is now placed in synchronism with the stored information as shown by the illustration in FIG. 2 subsequent to retard switch R in storage loop SN. In point of fact, in the illustration given, the input bubble is now substituted for the output bubble which was removed from the storage loop by operation of universal switch US1. The input bubble now takes the appropriate place in the information stream in the storage loop SN.

To more fully understand the information arrangement, reference is made to FIG. 3 wherein the storage information is shown comprising four bit operation. The four bits are represented by a circle, a triangle, a square and an inverted triangle, which pattern is repeated throughout the information chain. The circles represent consecutive bits in the same data stream. Likewise, the triangles represent consecutive bits in the same data chain as do the squares and the inverted triangle. The same data stream (chain) is shown in storage loop SN. However, certain information is transferred from storage loop SN to output decoder ODN via transfer switch T1. Thus, in this instance, the bubbles represent the circles transferred. Consequently, spaces appear in the information chains shown in storage loop SN. As shown in both FIGS. 2 and 3, the information which is selected by the decoder propagates along the appropriate path without delay. However, the information which is not selected by the decoder circuit is delayed one bit period as shown in the delayed decoder path line.

Figure 4:
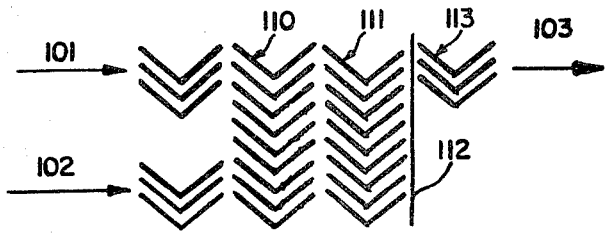
FIG. 4 is a schematic diagram of a merge-annihilator circuit used with the decoder organization of the instant invention.

Referring now to FIG. 4, there is shown, in detail, a merge annihilator (MA) which is equivalent to a logic AND gate. Input bubble paths 101 and 102 are merged into one output path 103 through merge annihilator 104. When one bubble propagates into merge annihilator 104 through either path 101 or 102 it will exit to path 103. However, if two bubbles simultaneously enter MA 104 on both paths 101 and 102. Only one bubble will exit to path 103 and the other will be, effectively, annihilated. For example when two bubbles propagate to chevron column 110 via paths 101 and 102, both bubbles may exist in the same chevron column. However, when the bubbles move to column 111 under the influence of the rotating field, the lower bubble is pushed upward by the magnetic pole produced at bar 112 toward position 113. The upper bubble already occupies that position and will repel the lower bubble. The lower bubble then collapses under the interaction of the forces produced by the upper bubble and bar 112. Bar 112 thus assures that the two bubbles merge into one bubble.

Thus, there is shown a single port decoder chip organization which offers definite advantages over a two port organization. The number of control components is the same in both types of organizations with the exception that a single-port chip requires one additional output transfer switch T3. The additional switching power required therefor is quite small when compared to the overall chip power. However, in the subject circuit both input and output decoders share the same decoder control. Thus, the number of control leads on the chip is greatly reduced. In addition, the single port configuration permits the opposite ends of the storage loops to be used for other functions. The optional output line is only one such function. The single port decoder chip organization shown and described herein uses only known components. No new or unusual components except the merge-annihilator are required in order to render this organization operative. However, the structure, as shown and described, is intended to be illustrative only. The description and drawings are not intended to be limitative. The scope of the invention is limited only by the claims appended hereto.

Having thus described a preferred embodiment of the invention, what is claimed is:

1. A bubble domain organization especially adapted for input and output operations at the same side thereof, said organization comprising:
   storage means,
   decoder means connected to said storage means, and
   input-output means comprising a continuous propagation path for receiving bubble domains from a bubble domain generator,
   at least one active transfer switch for transferring bubble domains from said continuous propagation path to said decoder means, and
   active switch means for transferring bubble domains into and out of said storage means from said decoder means, and
   at least one merge means for merging bubble domains into said continuous propagation path from said decoder means.

2. The organization recited in claim 1 including,
   retarding means connected between said decoder means and said storage means to selectively retard bubble domains propagating therethrough.

3. The organization recited in claim 1 including
   at least one replicator means formed as a part of said continuous propagation path, and
   connector propagation paths from said replicator means to said merge means.

4. The organization recited in claim 3 wherein
   said merge means comprises merge annihilator means for producing a single output bubble domain in response to one or more input bubble domains.

5. The organization recited in claim 4 wherein
   said merge annihilator means comprises
   first and second input paths,
   a single output path,
   at least one intermediate propagation section for receiving bubble domains from said first and second input paths such that the bubble domains become co-extensive with said intermediate propagation section, and
   pole producing means for assuring that a single bubble domain at said intermediate propagation section is transferred to said output path.

6. The organization recited in claim 1 wherein
   said decoder means comprises an input decoder and an output decoder.

7. The organization recited in claim 6 including first switch means for selectively switching bubble domains from said input decoder means to said storage means, and second switch means for selectively switching bubble domains from said storage means to said output decoder means.

8. The organization recited in claim 7 wherein, said first switch means comprises an exchange switch.

9. The organization recited in claim 7 including, exit path means connected between said first switch means and said merge means whereby bubble domains can be selectively switched from said output decoder means via said first switch means and supplied to said merge means.

10. The organization recited in claim 9 wherein said exit path means includes delay means for compensating for the length of said continuous propagation path means.

* * * * *